United States Patent
Lin et al.

(10) Patent No.: US 10,381,228 B2
(45) Date of Patent: Aug. 13, 2019

(54) EPITAXIAL PROCESS APPLYING LIGHT ILLUMINATION

(71) Applicant: UNITED MICROELECTRONICS CORP., Hsin-Chu (TW)

(72) Inventors: Yu-Ying Lin, Tainan (TW); Ted Ming-Lang Guo, Tainan (TW); Chin-Cheng Chien, Tainan (TW); Chih-Chien Liu, Taipei (TW); Hsin-Kuo Hsu, Kaohsiung (TW); Chin-Fu Lin, Tainan (TW); Chun-Yuan Wu, Yun-Lin County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 214 days.

(21) Appl. No.: 14/631,807

(22) Filed: Feb. 25, 2015

(65) Prior Publication Data

US 2016/0211144 A1    Jul. 21, 2016

(30) Foreign Application Priority Data

Jan. 15, 2015  (CN) ............................. 201510019753

(51) Int. Cl.
```
H01L 21/306     (2006.01)
H01L 21/3065    (2006.01)
H01L 29/08      (2006.01)
H01L 29/66      (2006.01)
H01L 29/78      (2006.01)
```
(52) U.S. Cl.
CPC .... *H01L 21/30608* (2013.01); *H01L 21/3065* (2013.01); *H01L 29/0847* (2013.01); *H01L 29/66795* (2013.01); *H01L 29/785* (2013.01)

(58) Field of Classification Search
CPC ...................... H01L 21/30608; H01L 21/3065
USPC ......................................................... 438/585
See application file for complete search history.

(56) References Cited

U.S. PATENT DOCUMENTS

| | | | |
|---|---|---|---|
| 6,890,835 B1 | 5/2005 | Chu | |
| 2002/0036183 A1* | 3/2002 | Shibata | G03F 7/40 216/44 |
| 2005/0159000 A1* | 7/2005 | Ohno | H01L 21/30612 438/689 |
| 2010/0059868 A1* | 3/2010 | Oi | B81B 7/0064 257/659 |
| 2014/0183637 A1* | 7/2014 | Cohen | H01L 21/82341 257/347 |
| 2016/0268430 A1* | 9/2016 | Nguyen | H01L 29/7848 |
| 2018/0145173 A1* | 5/2018 | Chang | H01L 29/7848 |

FOREIGN PATENT DOCUMENTS

| | | |
|---|---|---|
| CN | 102543990 A | 7/2012 |
| CN | 102983079 A | 3/2013 |
| JP | 1-199433 A | 8/1989 |

* cited by examiner

*Primary Examiner* — Moazzam Hossain
*Assistant Examiner* — Hajar Kolahdouzan
(74) *Attorney, Agent, or Firm* — Winston Hsu

(57) ABSTRACT

An epitaxial process applying light illumination includes the following steps. A substrate is provided. A dry etching process and a wet etching process are performed to form a recess in the substrate, wherein an infrared light illuminates while the wet etching process is performed. An epitaxial structure is formed in the recess.

17 Claims, 5 Drawing Sheets

EPITAXIAL PROCESS APPLYING LIGHT ILLUMINATION

BACKGROUND OF THE INVENTION

1. Field of the Invention

The present invention relates generally to an epitaxial process, and more specifically to an epitaxial process applying light illumination.

2. Description of the Prior Art

For decades, chip manufacturers have made metal-oxide-semiconductor (MOS) transistors faster by making them smaller. As the semiconductor processes advance to the very deep sub-micron era such as 65-nm node or beyond, how to increase the driving current for MOS transistors has become a critical issue. In order to improve device performance, crystal strain technology has been developed. Crystal strain technology is becoming more and more attractive as a means for getting better performance in the field of MOS transistor fabrication. Putting a strain on a semiconductor crystal alters the speed at which charges move through that crystal. Strain makes MOS transistors work better by enabling electrical charges, such as electrons, to pass more easily through the silicon lattice of the gate channel.

Attempts have been made to use a strained silicon layer, which has been grown epitaxially on a silicon substrate with a silicon germanium (SiGe) layer disposed therebetween. In this type of MOS transistor, a biaxial tensile strain occurs in the epitaxy silicon layer due to the silicon germanium which has a larger lattice constant than silicon. As a result, the band structure alters, and the carrier mobility increases. This enhances the speed performance of the MOS transistors.

As sizes of components shrink, sizes and shapes of epitaxial structures and distances of epitaxial structures to gates need to be controlled precisely. Thus, forming desired epitaxial structures has become an important issue in the semiconductor industry.

SUMMARY OF THE INVENTION

The present invention provides an epitaxial process applying light illumination, which illuminates an infrared light while the epitaxial process is performed, which changes etching rates to different crystal planes to form a desired epitaxial structure.

The present invention provides an epitaxial process applying light illumination which includes the following steps. A substrate is provided. A dry etching process and a wet etching process are performed to form a recess in the substrate, wherein an infrared light illuminates while the wet etching process is performed. An epitaxial structure is formed in the recess.

According to the above, the present invention provides an epitaxial process applying light illumination, which forms a recess in a substrate by a wet etching process illuminated by an infrared light to change etching rates to different crystal planes, so that the recess having a desired shape can be formed. Hence, an epitaxial structure formed in the recess can achieve a specific requirement. For instance, as the integration of integrated circuits increase, sizes of components shrink, and pitches between epitaxial structures become closer. Epitaxial structures having high depths and narrow widths not only can prevent the epitaxial structures from being too close to each other which would lead to the short channel effect and short circuit, but can also improve problems about diffusion of doped impurities such as boron in the epitaxial structures.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1-8 schematically depict a three dimensional diagram of an epitaxial process applying light illumination according to an embodiment of the present invention. A tri-gate MOSFET is shown in this embodiment, but the present invention is not restricted thereto. The present invention can also be applied in non-planar transistors such as multi-gate MOSFETs, or planar transistors.

Figure 1:
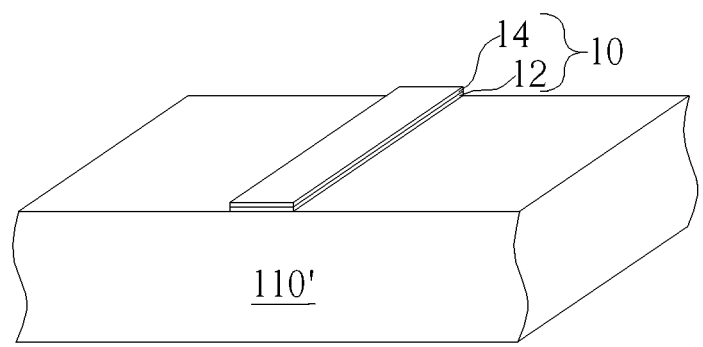
FIGS. 1-8 schematically depict a three dimensional diagram of an epitaxial process applying light illumination according to an embodiment of the present invention.
Figure 2:
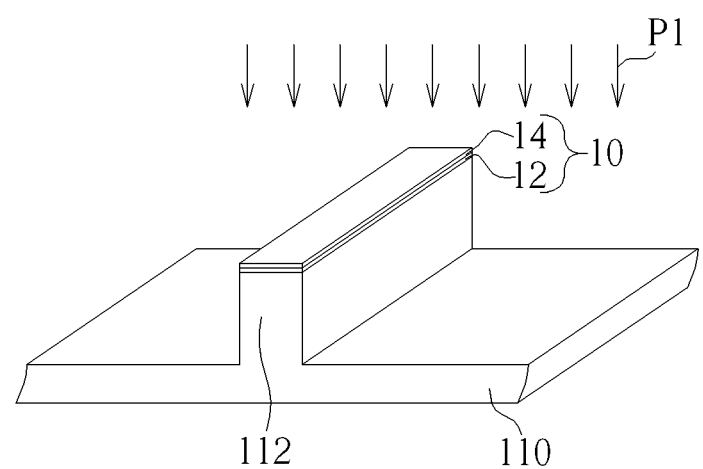

FIGS. 1-2 show a substrate 110 having a fin structure 112. In this embodiment, the fin structure 112 is only depicted once, but the number of fin structures 112 is not restricted thereto. More precisely, as shown in FIG. 1, a substrate 110' is provided. The substrate 110' may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. In this embodiment, the substrate 110' is a silicon substrate, so that an etchant in this embodiment can be applied later to etch the substrate 110' to form a recess, but this is not limited thereto.

Then, a patterned hard mask 10 is formed on the substrate 110' to define the location of the fin structure 112, which will be formed in the substrate 110'. In this embodiment, the patterned hard mask 10 is a dual structure including an oxide layer 12 and a nitride layer 14, but it is not limited thereto. Thereafter, an etching process P1 may be performed to form the fin structure 112 in the substrate 110', as shown in FIG. 2. Thus, the fin structure 112 located on the substrate 110 is formed completely. In this embodiment, the patterned hard mask 10 is removed immediately after the fin structure 112 is formed, and a tri-gate MOSFET can be formed in the following processes. There are three contact faces between the fin structure 112 and the following formed dielectric layer functioning as a carrier channel whose width is wider than a channel width in a conventional planar MOSFET. When a driving voltage is applied, the tri-gate MOSFET produces a double on-current compared to the conventional planar MOSFET. In another embodiment, the patterned hard mask 10 is reserved to form a fin field effect transistor (Fin FET), which is another kind of multi-gate MOSFET. Due to the patterned hard mask 10 being reserved in the fin field effect transistor, there are only two contact faces between the fin structure 112 and the following formed dielectric layer.

The present invention can also be applied to other semiconductor substrates. For example, a silicon-on-insulator substrate (not shown) is provided, and then a single crystalline silicon layer being a top part of the silicon-on-insulator substrate (not shown) is etched till an oxide layer being a middle part of the silicon-on-insulator substrate (not shown) is exposed, meaning the fin-shaped structure formed on the silicon-on-insulator substrate (not shown) is finished.

Figure 3:
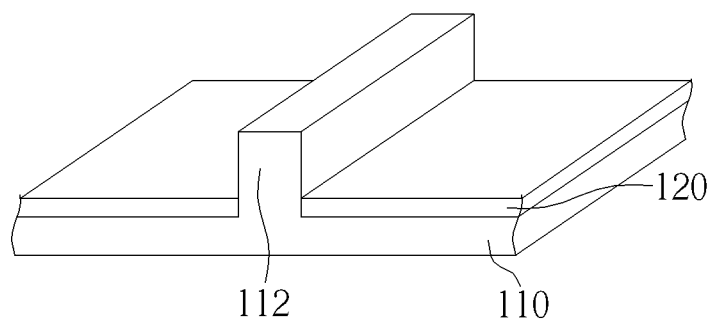

As shown in FIG. 3, an isolation structure 120 may be formed on the substrate 110 beside the fin structure 112. The isolation structure 120 may be a shallow trench isolation (STI) structure, which may be formed by processes such as depositing and back-etching, for example being disposed on a surface of the substrate 110 other than the fin structure 112, but this is not limited thereto.

Figure 4:
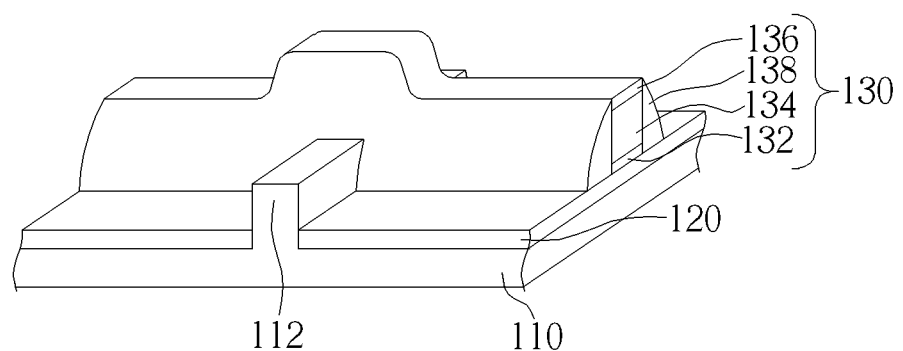

As shown in FIG. 4, a gate 130 may be formed to cover a part of the isolation structure 120 and disposed across the fin structure 112. The method of forming the gate 130 may include the following steps: a gate dielectric layer 132 is formed to cover part of the isolation structure 120 and across the fin structure 112; a gate electrode layer 134 covers the gate dielectric layer 132; a cap layer 136 covers the gate electrode layer 134; the cap layer 136, the gate electrode layer 134 and the gate dielectric layer 132 are patterned; and a spacer 138 is formed beside the gate dielectric layer 132, the gate electrode layer 134 and the cap layer 136. In one case, the gate dielectric layer 132 may be silicon oxide, silicon nitride, silicon oxynitride or metallic oxide having a high dielectric constant, such as the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST). The gate electrode layer 134 may be a highly doped polysilicon, metallic silicon oxide, or a metal gate such as a metallic silicon oxide, titanium, tantalum, titanium nitride, tantalum nitride or tungsten applying a gate-first process. In one embodiment, as the gate electrode layer 134 of the gate 130 is a polysilicon electrode layer, a gate-last process may be applied, which performs a replacement metal gate (RMG) process to replace the polysilicon electrode layer with a metal electrode layer. The cap layer 136 may be a single layer structure, a multilayer structure composed of silicon nitride or silicon oxide. The spacer 138 may be composed of silicon nitride or silicon oxide, and the spacer 138 may be a single layer structure or a multilayer structure including an inner spacer and an outer spacer. The methods of forming the gate 130 are well known in the art, and are not described herein.

Figure 5:
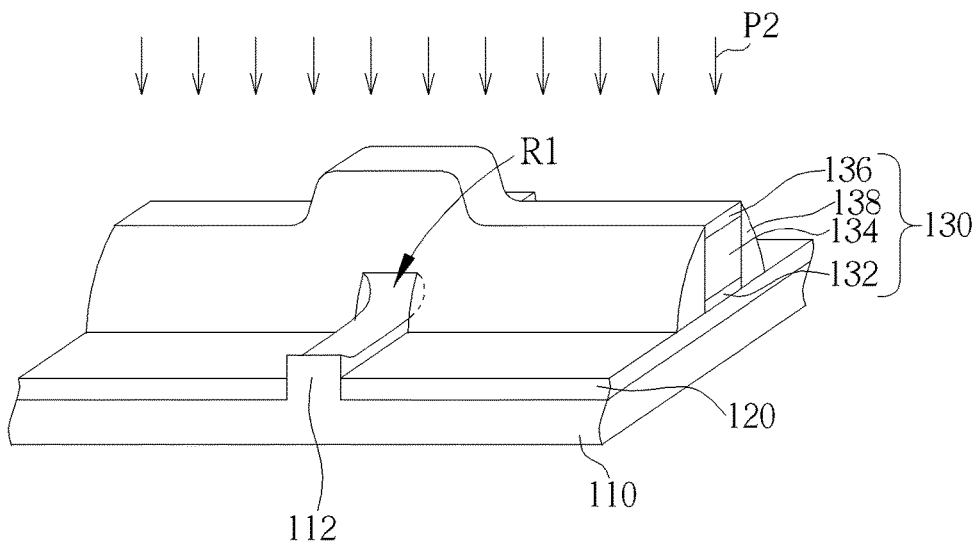

As shown in FIG. 5, a dry etching process P2 is performed to form recesses R1 in the fin structure 112 beside the gate 130. The dry etching process P2 may have fluorine gas and chlorine gas imported to etch the silicon fin structure 112.

Figure 6:
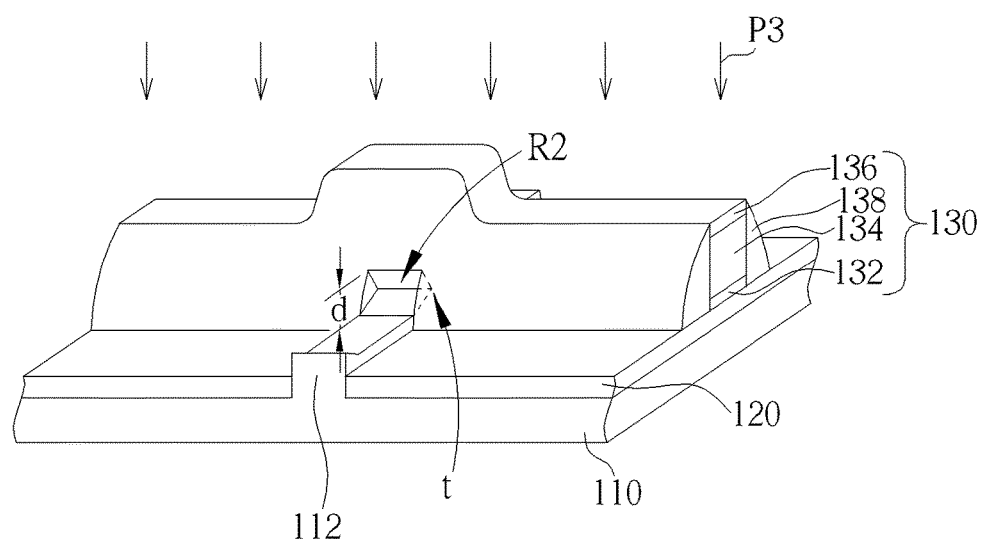

As shown in FIG. 6, a wet etching process P3 is performed to form recesses R2 in the fin structure 112 for later formed epitaxial structures in the recesses R2. The recesses R1 can be enlarged, modified, shape changed or have their surface roughness improved through performing the wet etching process P3, so that the recesses R2 having smooth surfaces for later formed epitaxial structures or buffer layers can be formed easily. It is emphasized that an infrared light must illuminate during the wet etching process P3 to form the recesses R2 having diamond-shaped cross-sectional profiles, wherein the depth d/the distance of the tip t to gate 130 of the diamond-shaped cross-sectional profile is preferably less than 25. The diamond-shaped cross-sectional profile may include a polygonal cross-sectional profile such as a rectangular, hexagonal or octagonal cross-sectional profile.

In a preferred embodiment, the depth d/the distance of the tip t to gate 130 of the diamond-shaped cross-sectional profile is 10. In this way, as the size of a component shrinks and pitches between the fin structures 112 become closer, epitaxial structures having high depths and narrow widths can be formed. Hence, the epitaxial structures beside the gate 130 can not only be prevented from being too close to each other which would lead to the short channel effect and short circuit, but problems regarding diffusion of doped impurities such as boron in the epitaxial structures can also be improved.

In a preferred embodiment, the wavelength of an infrared light illumination during the wet etching process P3 is less than 1.2 micrometers or within a range of 6~50 micrometers. Still preferably, the wavelength of an infrared light illumination during the wet etching process P3 is 0.85 micrometers for forming the desired recesses R2 in the silicon fin structure 112. In an aspect, as an infrared light illuminates during the wet etching process P3, the etching rate of the wet etching process P3 can be changed, and thus the etching rate of the wet etching process P3 to the crystal plane [100] can be different from that to the crystal plane [111]. In this embodiment, the etching rate of the wet etching process P3 to the crystal plane [100] is larger than that to the crystal plane [111] for forming the recesses R2. More precisely, the etching rate ratio of the wet etching process P3 to the crystal plane [100]/crystal plane [111] is preferably larger than 2; the etching rate ratio of the wet etching process P3 to crystal plane [100]/crystal plane [111] is still preferably larger than 2.27.

In a preferred embodiment, the etchant of the wet etching process P3 is an organic etchant, such that the wet etching process may be a tetramethylammonium hydroxide beilstein (TMAH) etching process, but it is not limited thereto. In another aspect, as the dry etching process P2 has fluorine gas and chlorine gas imported, the etchant of the wet etching process P3 is preferably an alkaline etchant to remove acid residues transforming from the fluorine and chlorine gas, but this is not restricted thereto.

Figure 7:
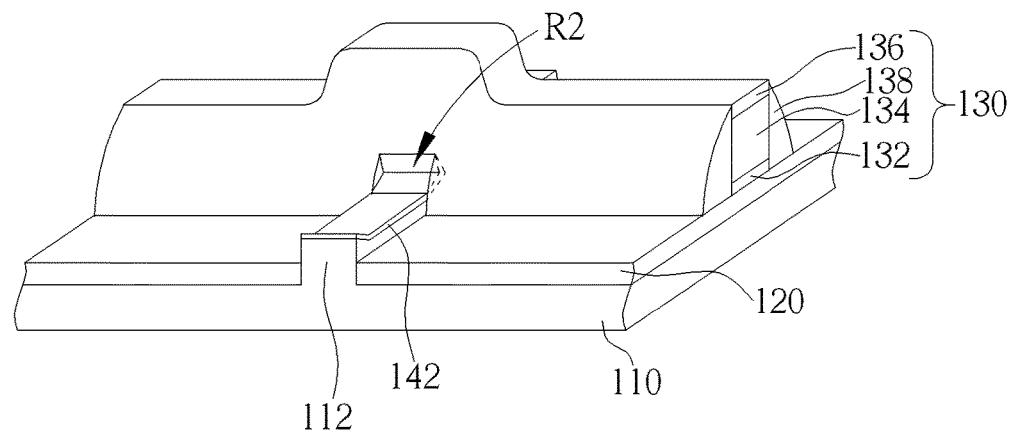

As shown in FIG. 7, buffer layers 142 may cover the recesses R2. The buffer layers 142 may be silicon epitaxial structures or doped epitaxial structures. The buffer layers 142 may conformally cover the recesses R2 to preserve the diamond-shaped cross-sectional profiles of the recesses R2. In addition, the buffer layers 142 may further smooth surfaces of the recesses R2.

Figure 8:
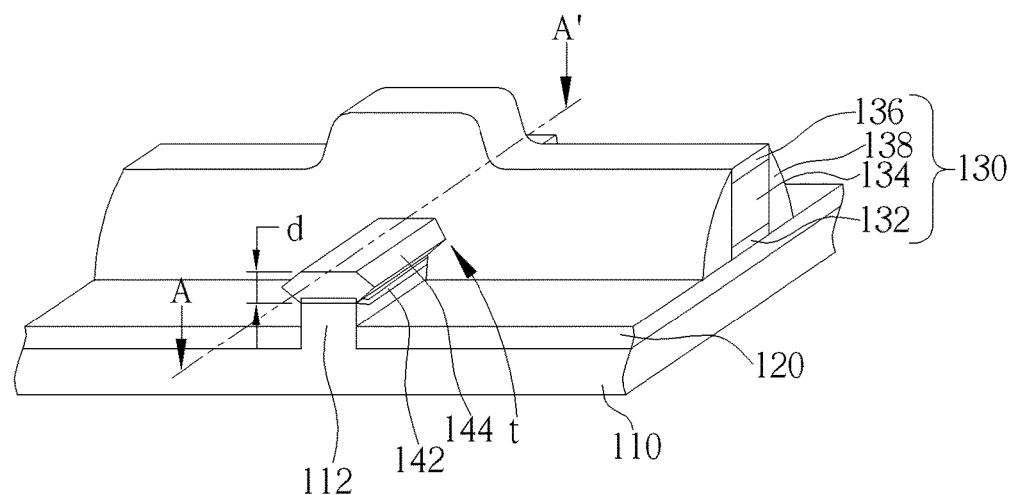

As shown in FIG. 8, a selective epitaxial growth (SEG) process is performed to form epitaxial structures 144 in the recesses R2 and on the buffer layers 142. Since each of the recesses R2 has a diamond-shaped cross-sectional profile, each of the epitaxial structures 144 inherently has a diamond-shaped cross-sectional profile as well. Furthermore, the depth d/the distance of the tip t to gate 130 of the diamond-shaped cross-sectional profile is preferably less than 25. Still preferably, the depth d/the distance of the tip t to gate 130 of the diamond-shaped cross-sectional profile is 10. In this way, as a size of a component shrinks and pitches between the fin structures 112 become closer, the epitaxial structures 144 having high depths and narrow widths can be formed. Hence, the epitaxial structures 144 beside the gate 130 not only can be prevented from being too close to each other which would lead to the short channel effect and short circuit, but problems related to diffusion of doped impurities such as boron in the epitaxial structures 144 can be improved.

Figure 9:
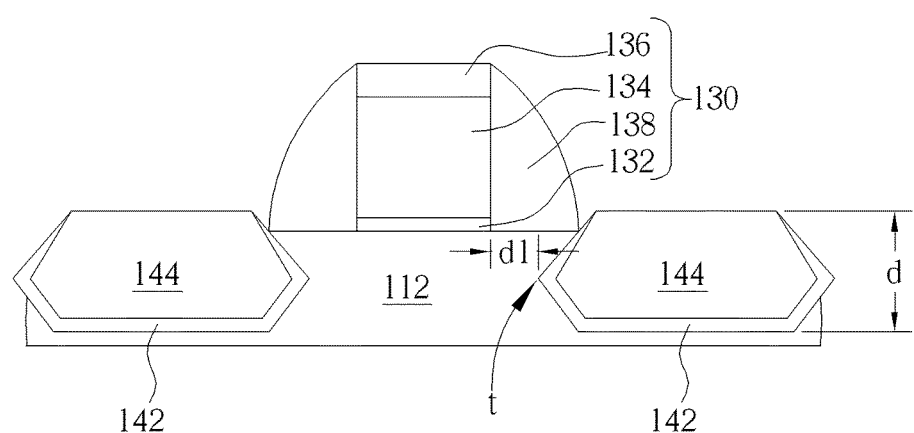
FIG. 9 schematically depicts a cross-sectional view of an epitaxial process applying light illumination along line AA' of FIG. 8.

In this embodiment, the epitaxial structures 144 may be silicon germanium epitaxial structures suitable for forming a PMOS transistor, but this is not limited thereto. In another embodiment, the epitaxial structures 144 may be silicon carbide epitaxial structures or silicon phosphorous epitaxial structures suitable for forming an NMOS transistor. For clarifying the present invention, FIG. 9 schematically depicts a cross-sectional view of an epitaxial process applying light illumination along line AA' of FIG. 8. The structure shown in FIG. 9 can be fabricated by the steps illustrated in FIGS. 1-8, wherein the buffer layers 142 and the epitaxial structures 144 are in the fin structure 112. The epitaxial structures 144 (or the buffer layers 142 and the epitaxial structures 144) have diamond-shaped cross-sectional profiles, wherein the depth d/the distance of the tip t to gate 130 of the diamond-shaped cross-sectional profile is less than 25; preferably, the depth d/the distance of the tip t to gate 130 of the diamond-shaped cross-sectional profile is 10.

Before the recesses R1 are formed and after/while the epitaxial structures 144 are formed, a single or multiple ion implantation processes and/or in-situ doped processes may be performed to dope impurities in the epitaxial structures 144, to form a lightly doped source/drain and a source/drain of a transistor or to enhance conductivity via doping impurities such as boron or phosphorous ions.

Accordingly, a non-planar transistor is presented in this embodiment, but the present invention can also be applied in a planar transistor. An infrared light can be applied while a wet etching process is performed to form recesses in a substrate beside a gate, for forming epitaxial structures therein. Methods of forming the recesses and the epitaxial structures of a planar transistor are similar to those for a non-planar transistor, and thus are not described again.

To summarize, the present invention provides an epitaxial process applying light illumination, which forms a recess in a substrate by a wet etching process illuminated by an infrared light to change etching rates for different crystal planes so the recess having a desired shape can be formed. Hence, an epitaxial structure formed in the recess can achieve a specific requirement. For instance, as the integration of the integrated circuits increases, sizes of the components will shrink and pitches between epitaxial structures become closer; the resultant epitaxial structures having high depth and narrow width not only may prevent the epitaxial structures from being too close to each other, thereby also preventing the short channel effect and short circuiting, but may also improve problems related to diffusion of doped impurities, such as boron, in the epitaxial structures.

The wavelength of an infrared light for illumination while the wet etching process is performed is less than 1.2 micrometers or within a range of 6~50 micrometers. Still preferably, the wavelength of the infrared light is 0.85 micrometers. Thereby, the etching rate of the wet etching process to the crystal plane [100] can be different from that to the crystal plane [111]. In this embodiment, the etching rate of the wet etching process to the crystal plane [100] is larger than that to the crystal plane [111] to form the recesses. More precisely, the etching rate ratio of the wet etching process to the crystal plane [100]/crystal plane [111] is preferably larger than 2, and more preferably is larger than 2.27.

The etchant of the wet etching process may be an organic etchant, such that the wet etching process may be a tetramethylammonium hydroxide beilstein (TMAH) etching process. Furthermore, before the recesses are formed by the wet etching process, a dry etching process may be performed to form pre-recesses. Due to the dry etching process importing fluorine and chlorine gas to etch a silicon substrate, the etchant of the wet etching process is preferably an alkaline etchant to further remove acid residues transformed from the fluorine and chlorine gas.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An epitaxial process applying light illumination, comprising:
    providing a substrate, wherein the substrate has at least a fin structure;
    forming a gate on the substrate;
    performing a dry etching process and a wet etching process to form a recess having a diamond-shaped cross-sectional profile in the substrate beside the gate, wherein an infrared light illuminates while the wet etching process is performed to change etching rates for different crystal planes, to form the recess having only one tip pointing toward a gate channel of the gate, and the recess is located in the fin structure; and
    forming an epitaxial structure in the recess.

2. The epitaxial process applying light illumination according to claim 1, wherein the dry etching process comprises imported fluorine gas and chlorine gas.

3. The epitaxial process applying light illumination according to claim 2, wherein the wet etching process comprises an alkaline etchant.

4. The epitaxial process applying light illumination according to claim 1, wherein the wet etching process comprises an organic etchant.

5. The epitaxial process applying light illumination according to claim 4, wherein the wet etching process comprises a tetramethylammonium hydroxide beilstein (TMAH) etching process.

6. The epitaxial process applying light illumination according to claim 1, wherein the wavelength of the infrared light is less than 1.2 micrometers or within a range of 6~50 micrometers.

7. The epitaxial process applying light illumination according to claim 6, wherein the wavelength of the infrared light is 0.85 micrometers.

8. The epitaxial process applying light illumination according to claim 1, wherein the etching rate of the wet etching process to a crystal plane [100] is different from that to a crystal plane [111].

9. The epitaxial process applying light illumination according to claim 8, wherein the etching rate of the wet etching process to crystal plane [100] is larger than that to crystal plane [111].

10. The epitaxial process applying light illumination according to claim 9, wherein the etching rate ratio of the wet etching process to crystal plane [100]/crystal plane [111] is larger than 2.

11. The epitaxial process applying light illumination according to claim 10, wherein the etching rate ratio of the wet etching process to crystal plane [100]/crystal plane [111] is 2.27.

12. The epitaxial process applying light illumination according to claim 1, wherein the epitaxial structure has a diamond-shaped cross-sectional profile.

13. The epitaxial process applying light illumination according to claim 12, wherein a depth of the epitaxial structure/a distance of a tip of the epitaxial structure to gate is less than 25.

14. The epitaxial process applying light illumination according to claim 13, wherein a depth of the epitaxial structure/a distance of a tip of the epitaxial structure to gate is 10.

15. The epitaxial process applying light illumination according to claim 1, wherein the substrate comprises a silicon substrate.

16. The epitaxial process applying light illumination according to claim 1, wherein the epitaxial structure comprises a silicon germanium epitaxial structure.

17. The epitaxial process applying light illumination according to claim 1, further comprising:
   forming a buffer layer covering the recess before the epitaxial structure is formed.

* * * * *